(12) United States Patent
Yu et al.

(10) Patent No.: US 8,878,252 B2
(45) Date of Patent: Nov. 4, 2014

(54) III-V COMPOUND SEMICONDUCTOR EPITAXY FROM A NON-III-V SUBSTRATE

(71) Applicant: Taiwan Semiconductor Manufacturing Company, Ltd., Hsin-Chu (TW)

(72) Inventors: Chia-Lin Yu, Sigang (TW); Chen-Hua Yu, Hsin-Chu (TW); Ding-Yuan Chen, Taichung (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/179,007

(22) Filed: Feb. 12, 2014

(65) Prior Publication Data

US 2014/0159208 A1    Jun. 12, 2014

Related U.S. Application Data

(63) Continuation of application No. 13/740,733, filed on Jan. 14, 2013, now Pat. No. 8,686,474, which is a continuation of application No. 12/539,374, filed on Aug. 11, 2009, now Pat. No. 8,377,796.

(60) Provisional application No. 61/087,913, filed on Aug. 11, 2008.

(51) Int. Cl.
*H01L 21/02*    (2006.01)
*H01L 29/12*    (2006.01)

(52) U.S. Cl.
CPC ...... *H01L 21/02365* (2013.01); *H01L 21/0237* (2013.01); *H01L 21/02639* (2013.01); *H01L 21/02458* (2013.01); *H01L 21/02502* (2013.01); *H01L 29/12* (2013.01); *H01L 21/02645* (2013.01); *H01L 21/02104* (2013.01); *H01L 21/02381* (2013.01); *H01L 21/02491* (2013.01); *H01L 21/02642* (2013.01); *H01L 21/02538* (2013.01)
USPC ............ 257/200; 257/183; 257/E21.575; 438/429; 438/478

(58) Field of Classification Search
USPC .......................................................... 438/44
See application file for complete search history.

(56) References Cited

U.S. PATENT DOCUMENTS

| | | | |
|---|---|---|---|
| 6,312,967 B1 | 11/2001 | Ikeda | |
| 6,939,733 B2 | 9/2005 | Shibata et al. | |
| 6,955,977 B2 | 10/2005 | Kong et al. | |
| 7,128,786 B2 | 10/2006 | Jurgensen et al. | |
| 7,338,828 B2 | 3/2008 | Imer et al. | |

(Continued)

OTHER PUBLICATIONS

Smart, et al., "Single Step Process for Epitaxial Lateral Overgrowth of GaN on SiC and Sapphire Structures," Applied Physics Letters, Dec. 13, 1999, pp. 3820-3822, vol. 75, No. 24.

(Continued)

*Primary Examiner* — Angel Roman
(74) *Attorney, Agent, or Firm* — Slater & Matsil, L.L.P.

(57) ABSTRACT

A structure comprises a substrate, a mask, a buffer/nucleation layer, and a group III-V compound semiconductor material. The substrate has a top surface and has a recess from the top surface. The recess includes a sidewall. The first mask is the top surface of the substrate. The buffer/nucleation layer is along the sidewall, and has a different material composition than a material composition of the sidewall. The III-V compound semiconductor material continuously extends from inside the recess on the buffer/nucleation layer to over the first mask.

20 Claims, 11 Drawing Sheets

(56) References Cited

U.S. PATENT DOCUMENTS

| | | |
|---|---|---|
| 2002/0022287 A1 | 2/2002 | Linthicum et al. |
| 2002/0046693 A1 | 4/2002 | Kiyoku et al. |
| 2002/0069816 A1 | 6/2002 | Gehrke et al. |
| 2002/0187356 A1 | 12/2002 | Weeks et al. |
| 2003/0006409 A1 | 1/2003 | Ohba |
| 2003/0092230 A1 | 5/2003 | Koike et al. |
| 2003/0111008 A1 | 6/2003 | Strittmatter et al. |
| 2003/0141512 A1 | 7/2003 | Bruderl et al. |
| 2003/0162340 A1 | 8/2003 | Tezen |
| 2005/0003572 A1 | 1/2005 | Hahn et al. |
| 2007/0178676 A1 | 8/2007 | Oda |
| 2007/0190678 A1 | 8/2007 | Shin |
| 2008/0210951 A1 | 9/2008 | Jiang et al. |
| 2008/0308835 A1 | 12/2008 | Pan |
| 2010/0044719 A1 | 2/2010 | Yu et al. |

OTHER PUBLICATIONS

Zheleva, et al., "Dislocation Density Reduction Via Lateral Epitaxy in Selectively Grown GaN Structures," Applied Physics Letters 71 (17), Oct. 27, 1997, Downloaded Nov. 20, 2009, pp. 2472-2474.

Zheleva, et al., "Thermal Mismatch Stress Relaxation Via Lateral Epitaxy in Selectively Grown GaN Structures," Applied Physics Letters, Apr. 26, 1999, pp. 2492-2494, vol. 75, No. 24.

III-V COMPOUND SEMICONDUCTOR EPITAXY FROM A NON-III-V SUBSTRATE

This application is a continuation of U.S. patent application Ser. No. 13/740,733, filed on Jan. 14, 2013, entitled "III-V Compound Semiconductor Epitaxy From a Non-III-V Substrate," which is a continuation of U.S. patent application Ser. No. 12/539,374, filed on Aug. 11, 2009, entitled "III-V Compound Semiconductor Epitaxy From a Non-III-V Substrate," which claims the benefit of U.S. Provisional Application No. 61/087,913 filed on Aug. 11, 2008, entitled "III-V Compound Semiconductor Epitaxy From a Non-III-V Substrate," which applications are hereby incorporated herein by reference in their entireties.

TECHNICAL FIELD

This invention relates generally to semiconductor circuit manufacturing processes, and more particularly to forming group-III group-V compound semiconductor films.

BACKGROUND

Group-III group-V compound semiconductors, commonly referred to as III-V compound semiconductors, have been under intense research in recent years due to their promising applications in electronic and optoelectronic devices. When the group V element in a III-V compound semiconductor is nitrogen, the compound semiconductor is referred to as a III-N compound semiconductor. The III-N compound semiconductor GaN is widely used in optoelectronic devices. Particular examples of potential optoelectronic devices employing GaN include blue light emitting diodes and laser diodes, and ultra-violet (UV) photo-detectors. The large bandgap and high electron saturation velocity of III-N compound semiconductors also make them excellent candidates for applications in high temperature and high-speed power electronics.

Due to the high equilibrium pressure of nitrogen at typical growth temperatures, it is extremely difficult to fabricate GaN bulk substrates. Owing to the lack of feasible bulk growth methods, films of GaN are commonly deposited epitaxially on dissimilar substrates, such as SiC or sapphire ($Al_2O_3$). However, a current problem with the manufacturing of GaN thin films is that there is no readily available suitable dissimilar substrate material whose lattice constant and thermal expansion coefficient closely matching those of GaN. If the difficulties of growing GaN films on silicon substrates could be overcome, silicon substrates would be attractive for GaN growth given their low cost, large diameter, high crystal and surface quality, controllable electrical conductivity, and high thermal conductivity. The use of silicon substrates would also provide easy integration of GaN based optoelectronic devices with silicon-based electronic devices.

Additionally, due to the lacking of appropriate substrates for growing GaN films thereon, the sizes of the GaN films are limited. The large stresses created by growing a GaN film on a dissimilar substrate may cause the substrate to bow. This bowing may cause several adverse effects. First, a great number of defects (dislocations) will be generated in the supposedly crystalline GaN films. Second, the thicknesses of the resulting GaN films will be less uniform, causing wavelength shifts of the light emitted by the optical devices formed on the GaN films. Third, cracks may be generated in large stressed GaN films.

Epitaxial lateral overgrowth (ELOG) techniques have been used to form GaN films on dissimilar substrates that have reduced stress and reduced dislocations therein. FIGS. 1 and 2 illustrate a structure comprising a film of GaN formed using ELOG. Referring to FIG. 1, underlayer 4, which comprises a III-N compound semiconductor, is formed on substrate 2, followed by the formation of III-N compound semiconductor layer 6. Recesses 7 are then formed in III-N compound semiconductor layer 6. Next, as shown in FIG. 2, first masks 8 and second masks 10 are formed on the upper surface portions of III-N compound semiconductor layer 6 and the bottoms of recesses 7, respectively. III-N compound semiconductor 12 is then epitaxially grown starting from the sidewalls of recesses 7. Having the III-N compound semiconductor 12 film grow laterally from the sidewalls tends to reduce the number of dislocations in the resulting film of III-N compound semiconductor 12. A disadvantage of the method shown in FIGS. 1 and 2 is that the formation of under-layer 4, III-N compound semiconductor layer 6, and masks 8 and 10 are additional process steps that increase the overall manufacturing cost.

FIGS. 3 and 4 illustrate an alternative ELOG process. First, as shown in FIG. 3, substrate 14 is provided. Recesses 15 are then formed in substrate 14. Next, as shown in FIG. 4, III-N compound semiconductor portions 16 are formed, which include portions $16_1$ in recesses 15, and portions $16_2$ on the protruding portions of substrate 14. The method shown in FIGS. 3 and 4 requires that the growth of III-N compound semiconductor films be suppressed on the sidewalls of recesses 15 so that portions $16_2$ will grow laterally and coalesce with neighboring portions $16_2$ in order to form a continuous film over substrate 14. However, the ELOG method shown in FIGS. 3 and 4 also has significant vertical growth of III-N compound semiconductor portions $16_2$, so the reduction in the number of dislocations provided by lateral growth is limited. The process is further complicated by the fact that the recesses 15 must be deep enough to prevent $16_1$ and $16_2$ from coalescence. New methods that fully use the advantageous feature of ELOG, while at the same time having reduced process complexity, are thus needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

Novel methods for forming group-III group-V (referred to as III-V hereinafter) compound semiconductor films on dissimilar substrates are provided. Throughout the description, the term "III-V compound semiconductor" refers to compound semiconductor materials comprising at least one group-III element and one group-V element. The term "III-N compound semiconductor" refers to a III-V compound semiconductor in which at least one of the group-V elements is nitrogen. The required stages of manufacturing an illustrative embodiment of the present invention are illustrated. Those skilled in the art will recognize that other manufacturing steps may need to take place before or after the described stages in order to produce a complete device. Throughout the various views and illustrative embodiments of the present invention, like reference numbers are used to designate like elements.

Figure 1:
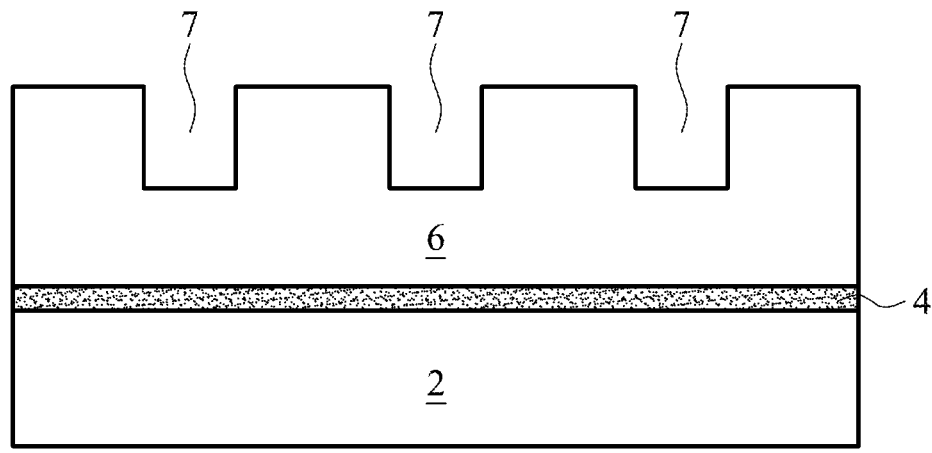
FIGS. 1 and 2 illustrate an epitaxial layer overgrowth (ELOG) process for forming a III-V compound semiconductor film on a dissimilar substrate.
Figure 2:
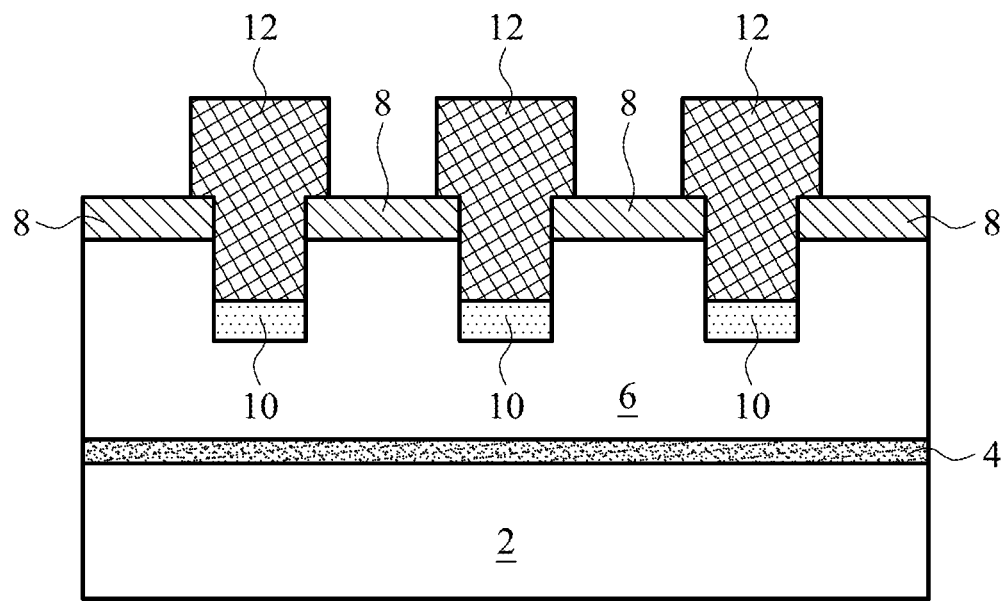
Figure 3:
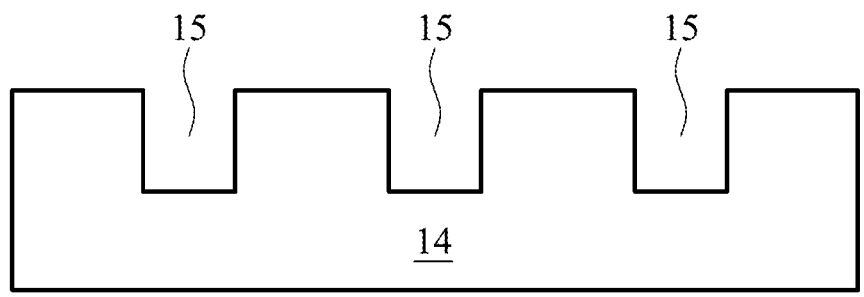
FIGS. 3 and 4 illustrate an alternative ELOG process for forming a III-V compound semiconductor film on a dissimilar substrate.
Figure 4:
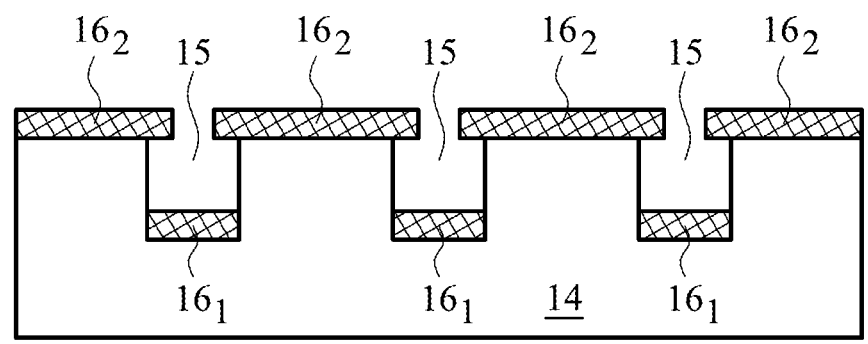
Figure 5:
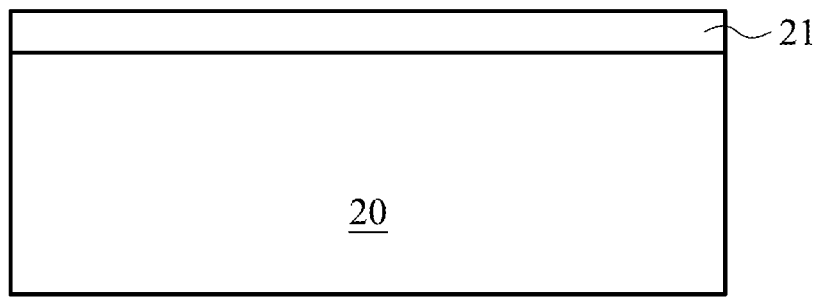
FIGS. 5 through 14B are views of stages in the manufacturing of embodiments of the present invention.

FIGS. 5 through 9 illustrate a first set of embodiments. Referring to FIG. 5, substrate 20 is provided. In certain embodiments substrate 20 is a bulk substrate comprising, for example, a bulk semiconductor material, such as silicon. Alternatively, substrate 20 may comprise a multilayer structure, such as a semiconductor-on-insulator (SOI) structure, which has a buried oxide layer in between two silicon layers. Substrate 20 may also be formed of other commonly used substrate materials, such as sapphire, SiGe, SiC, Ge, ZnO, ZnSe, ZnS, GaP, or GaAs. Substrate 20 is typically subjected to a pre-clean step to remove contamination before any films are deposited on substrate 20.

Next, mask layer 21 is formed on substrate 20. Mask layer 21 may include a material selected from dielectric materials, such as $SiN_x$ or $SiO_x$ (with $0<x\leq3$); metals, such as W, Mg, Ag, Al, Ti, or Cr; metal alloys, such as Ti—Al or Al—Ag; metal nitrides, such as TiN or TaN; metal carbides, such as TaC or TiC; or metal carbon-nitrides such as TiCN or TaCN. Mask layer 21 may also include multi-layers of the above-discussed materials. The applicable deposition methods for forming mask layer 21 include physical vapor deposition (PVD) and chemical vapor deposition (CVD). In some embodiments it may be advantageous to use conductive materials for mask layer 21, so that mask layer 21 also has the function of providing a conductive path in vertical optoelectronic devices, in which the two external contacts for the device are formed on opposite sides of substrate 20. This is particularly advantageous if high-resistivity materials are formed between substrate 20 and the overlying III-V compound semiconductor layers.

Figure 6A:
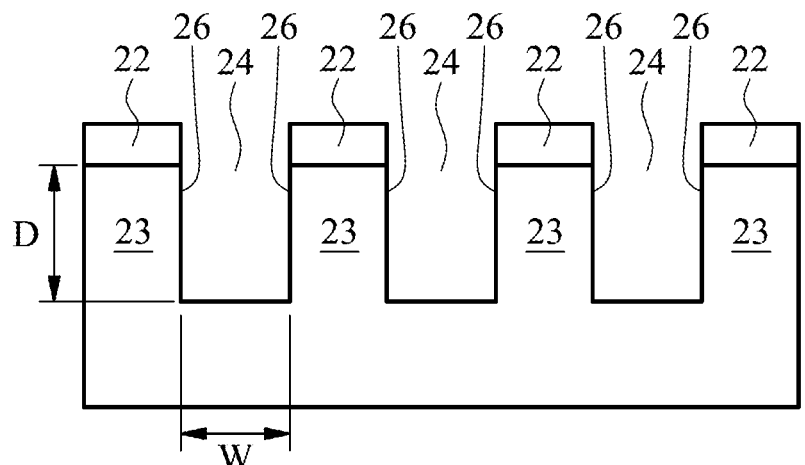
Figure 6B:
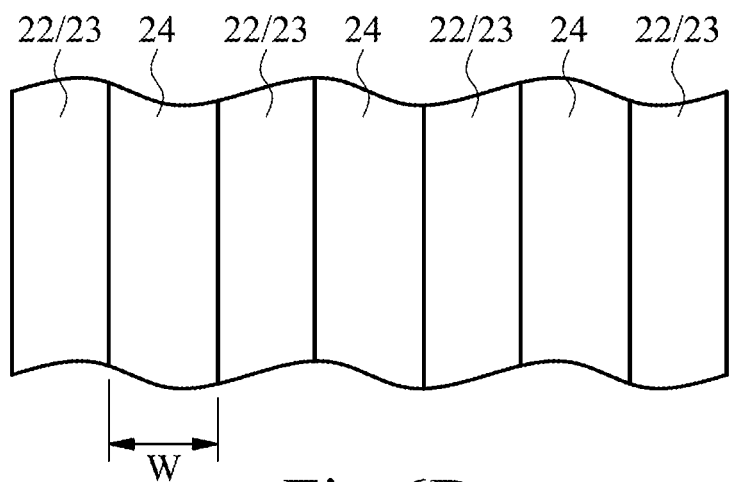

Next, mask layer 21 and underlying substrate 20 are patterned to form masks 22 and recesses 24 shown in FIGS. 6A and 6B. The patterning may be performed using a dry etch and/or a wet etch. In the embodiment shown in FIGS. 6A and 6B, recesses 24 are long trenches, and hence the portions of substrate 20 (referred to as protrusions 23 hereinafter) between recesses 24 are strips, as shown in FIG. 6B, which is a top view of the structure shown in FIG. 6A. In alternative embodiments, recesses 24 or protrusions 23 may have other shapes with controlled widths and spacings, and may form an array or other periodic patterns, with each having a shape (in a top view) of a square, a strip, or a polygon. In the case, substrate 20 is a silicon substrate, the crystal orientation and the direction of recesses 24 may be selected so that sidewalls 26 have a (111) surface orientation, although other surface orientations may also be used.

Preferably, the width W of each of recesses 24 is between about 0.05 μm and about 1 μm. The depth D of recesses 24 is between about 0.05 μm and about 5 μm. One skilled in the art will realize, however, that the dimensions recited throughout the description are merely examples, and will change if different formation technologies are used. The depth D of recesses 24 should be selected so that the recesses 24 are not too shallow to provide an adequate amount of sidewall for film growth, and not too deep to inhibit the growth of films within recesses 24.

Figure 7:
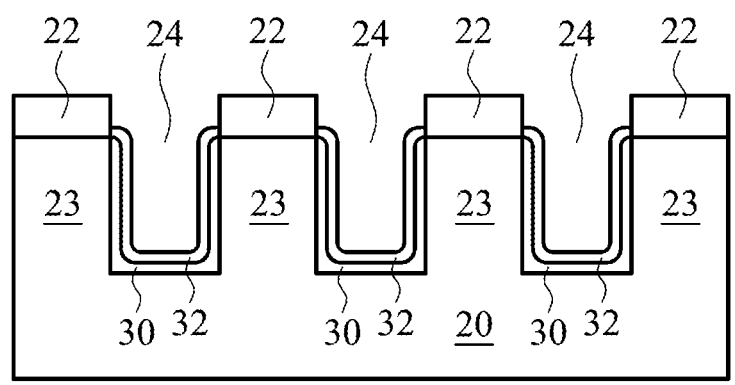

FIG. 7 illustrates the formation of an optional intermediate layer 30 and a buffer/nucleation layer 32 on both the bottom and sidewalls of recesses 24. In an embodiment, intermediate layer 30 is a pre-seeding layer, which is defined within this disclosure as a layer comprising a metal, such as Al, Mg, Ga, In, Zn, and combinations thereof. The pre-seeding layer may be deposited by CVD or PVD. A pre-seeding layer functions to help the adhesion of the overlying layers to the underlying layers. In alternative embodiments, intermediate layer 30 is a transition layer, which is defined within this disclosure as a layer comprising a metal, such as Ti or Ag; a metal alloy, such as Ti—Al; a metal nitride, such as TiN or TaN (excluding III-N compound semiconductors, such as AN, GaN, InGaN, and InAlN); a metal-carbide, such as TaC or TiC; or a metal carbon-nitride, such as TiCN or TaCN. A transition layer has characteristics (e.g. lattice constant, thermal expansion coefficient) with values between those of the underlying layer and the overlying layer in order to reduce the stress between the underlying and overlying layers. Intermediate layer 30 may also comprise a combination of a pre-seeding layer and a transition layer. In some embodiments, any portion of intermediate layer 30 formed on masks 22 is removed. The thickness of intermediate layer 30 may be between about 1 nm and about 100 nm.

Preferably, buffer/nucleation layer 32 is also formed only on the sidewall and bottom surfaces of recesses 24, and alternatively on the optional intermediate layer 30, if present, but not directly on masks 22. Buffer/nucleation layer 32 functions to help the nucleation of the overlying layer of the III-V compound semiconductor when the overlying layer is epitaxially grown, and hence may be formed using a semiconductor material that may crystallize at high temperatures. In an embodiment, buffer/nucleation layer 32 comprises a III-V compound semiconductor material such as a III-N compound semiconductor (for example, GaN), and may be formed at a lower temperature than the temperature for growing the overlying layer of the III-V compound semiconductor (item 36 in FIG. 8). Alternatively, buffer/nucleation layer 32 may comprise silicon-containing materials. In some embodiments, buffer/nucleation layer 32 may comprise essentially the same, or similar, materials as the overlying III-V compound semiconductor layer 36 (not shown in FIG. 7, refer to FIG. 8). In an exemplary embodiment, buffer/nucleation layer 32 is formed using PVD or CVD.

Figure 8:
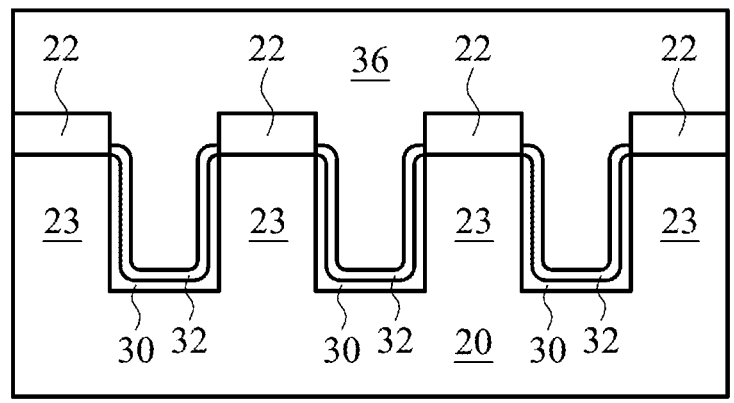

Referring to FIG. 8, III-V compound semiconductor layer 36 is epitaxially grown from recesses 24. III-V compound semiconductor layer 36 is formed at a relatively high temperature, for example, about 1050° C., and hence forms a crystalline structure as compared to the more amorphous structure in buffer/nucleation layer 32. In an embodiment, III-V compound semiconductor layer 36 is a III-N compound semiconductor layer comprising a material selected from GaN, InN, AlN, $In_xGa_{(1-x)}N$, $Al_xGa_{(1-x)}N$, $Al_xIn_{(1-x)}N$, $Al_xIn_yGa_{(1-x-y)}N$, and combinations thereof, wherein each of x and y is greater than 0 and less than 1. The formation methods include metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), and liquid phase epitaxy (LPE).

Initially, III-V compound semiconductor layer 36 comprises a plurality of discrete portions, each grown inside one of recesses 24. Since significant portions of the surfaces from which III-V compound semiconductor layer 36 is grown are sidewalls, there is significant lateral overgrowth, and hence in the resulting III-V compound semiconductor layer 36, the number of lattice dislocations is reduced. After portions of III-V compound semiconductor layer 36 grow above the top surface of masks 22, further lateral growth occurs as the layer grows laterally over masks 22 and eventually coalesces into the continuous film shown in FIG. 8.

Figure 9:
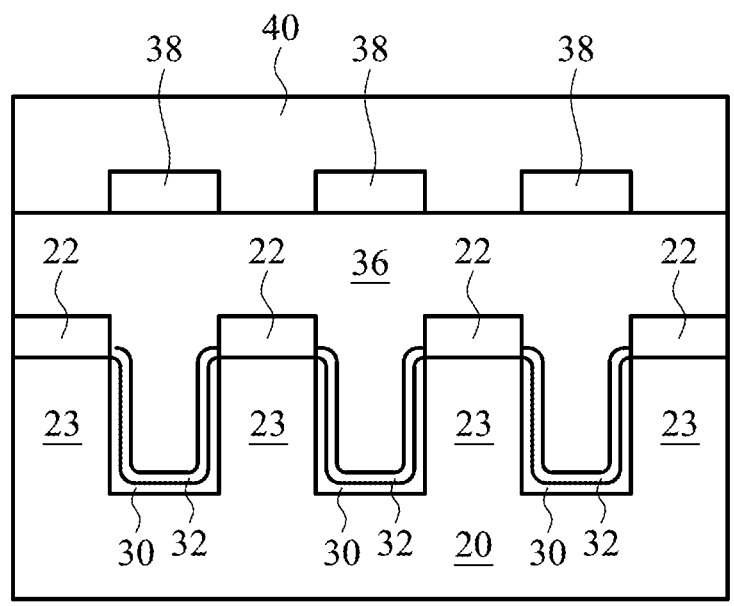

Referring to FIG. 9, additional masks 38 and an additional III-V compound semiconductor layer 40 are formed over the III-V compound semiconductor layer 36. Additional masks 38 may be formed of the same materials as masks 22 and may be formed using the same methods used to form masks 22. Similarly, additional III-V compound semiconductor layer 40 may be formed of the same materials as III-V compound semiconductor layer 36 and formed using the same methods used to form III-V compound semiconductor layer 36. Preferably, portions of additional masks 38 are directly over and substantially cover recesses 24. Additional masks 38 typically would be laid out the same way as masks 22, which means that in some embodiments both masks 22 and additional masks 38 are strips. The growth of additional III-V compound semiconductor layer 40 includes a vertical component and a lateral component, wherein the lateral component eventually causes the portions of the layer growing out of the gaps between additional masks 38 to coalesce over additional masks 38 to form a continuous III-V compound semiconductor layer 40. Advantageously, by placing additional masks 38 directly over the spacings between masks 22, the vertical growth component within III-V compound semiconductor layer 36 is blocked, and the resulting lateral growth further reduces dislocations in III-V compound semiconductor layer 40.

After the formation of III-V compound semiconductor layer 40, which may be doped or un-doped, an optoelectronic device (not shown) may be formed over layer 40. The optoelectronic device may include at least one of the following structures: a P—N junction, a homojunction, heterojunction, a single-quantum well (SQW), or a multi-quantum well (MQW) (not shown). One skilled in the art will be familiar with the standard optoelectronic structures employing III-V compound semiconductors that would be beneficially fabricated on the low-defect III-V compound semiconductor layer 40. Exemplary optoelectronic devices compatible with embodiments of the invention include a light-emitting diode and a photo diode.

Figure 10:
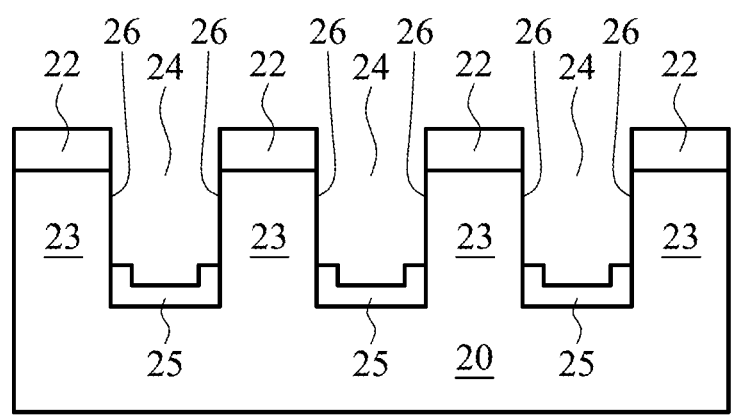
Figure 11A:
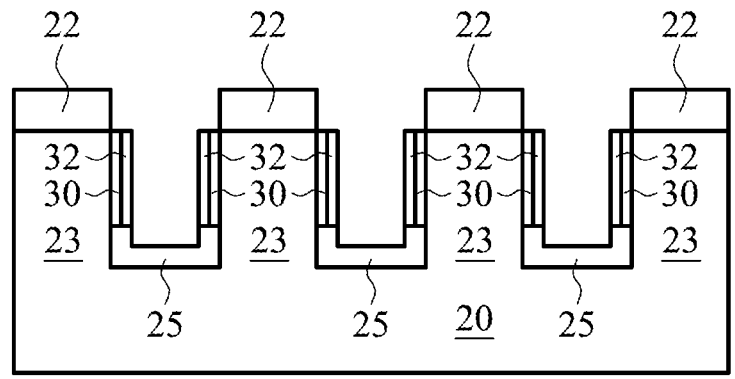
Figure 11B:
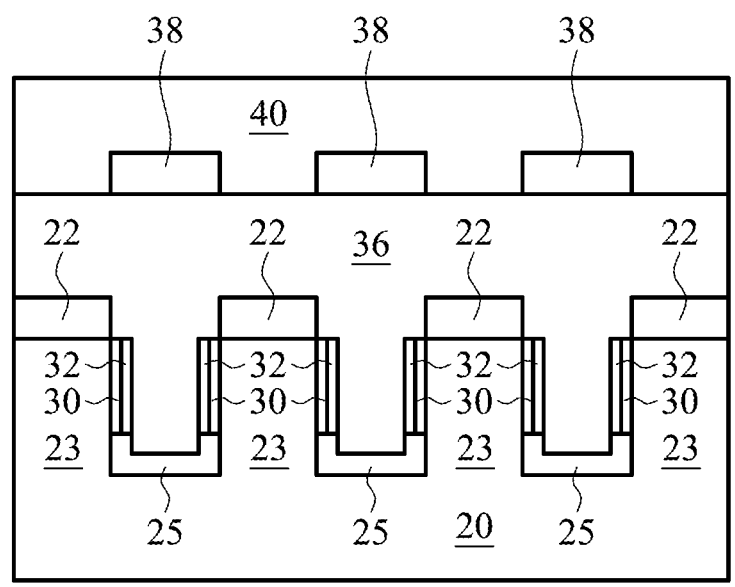

FIGS. 10 through 11B illustrate alternative embodiments of the present invention. In the embodiments discussed in subsequent paragraphs, unless specifically discussed, like elements are referred to using like reference numerals as referred to in the preceding paragraphs. The initial steps of this embodiment, which are the steps up to and including the formation of recesses 24 and masks 22, are essentially the same as shown in FIGS. 5 through 6B. Next, as shown in FIG. 10, second masks 25 are formed inside, and cover the bottom of, recesses 24, wherein at least portions of sidewalls 26 of recesses 24 are exposed. The formation process of second masks 25 may include blanket forming a mask layer, and then etching the mask layer, leaving second masks 25. The etching of the mask layer may be performed with, or without, the help of a photo resist. One skilled in the art will realize the corresponding process steps.

FIG. 11A illustrates the formation of optional intermediate layer 30 and the selective formation of buffer/nucleation layer 32, which are formed only on the exposed sidewalls of recesses 24, but not on masks 22 and second masks 25. In embodiments in which an intermediate layer 30 is formed, a lithography step may be, or may not be, needed to remove undesirable portions of the intermediate layer 30 formed on masks 22 and second masks 25. In embodiments in which no intermediate layer 30 is formed, the buffer/nucleation layer 32 is formed directly on the exposed sidewalls 26 of recesses 24 using selective formation techniques.

FIG. 11B shows III-V compound semiconductor layer 36 that started growing from buffer/nucleation layer 32 on sidewalls 26 of recesses 24, and eventually grew out of recesses 24 and coalesced into a continuous layer. The embodiment in FIG. 11B also comprises additional masks 38 and additional III-V compound semiconductor layer 40. The details of the growth of III-V compound semiconductor layers 36 and 40 and additional masks 38 may be essentially the same as provided in the preceding paragraphs, and hence are not repeated herein.

In yet other embodiments of the present invention, instead of forming second masks 25 at the bottoms of recesses 24, a semiconductor-on-insulator (SOI) substrate is used, with the SOI substrate comprising a semiconductor layer over a buried oxide. The initial steps may also be essentially the same as those shown in FIGS. 5 through 6B. In these embodiments, after the formation of recesses 24, the buried oxide of the SOI substrate is exposed through recesses 24. The buried oxide serves as the functional equivalent to second masks 25 and the steps shown in FIGS. 11A and 11B may then be performed.

Figure 12:
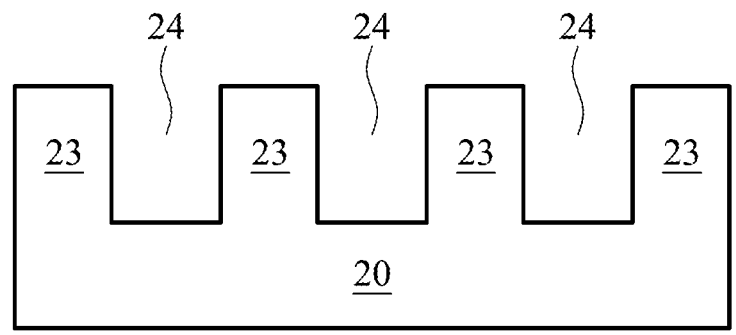
Figure 13:
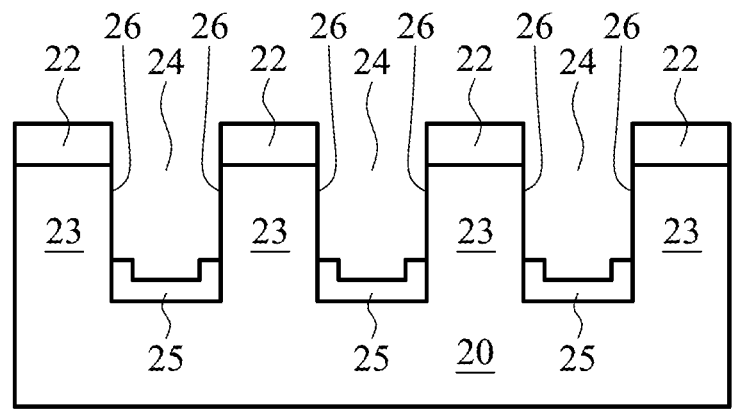

FIGS. 12 and 13 illustrate yet another embodiment of the present invention. Referring to FIG. 12, substrate 20 is provided. Recesses 24 are then formed in substrate 20, for example, using lithography techniques. Next as shown in FIG. 13, masks 22 and second masks 25 are formed. Masks 22 are outside recesses 24 and over protrusions 23. Second masks 25 are inside, and cover the bottom of, recesses 24. In a first embodiment, masks 22 and second masks 25 are formed simultaneously, and are formed of a same material. The formation process may include depositing a mask layer, and patterning the mask layer, leaving masks 22 and masks 25. In alternative embodiments, masks 22 and second masks 25 are formed of different materials, which materials may be selected from the materials discussed in the preceding paragraphs. The subsequent steps are essentially the same as shown in FIGS. 11A and 11B. Again, sidewalls 26 of recesses 24 are exposed. In subsequent process steps, optional intermediate layer 30, buffer/nucleation layer 32, III-V compound semiconductor layer 36, additional masks 38 and additional III-V compound semiconductor layer 40 may be formed. Since the processes are similar to those shown in FIGS. 11A and 11B, the details are not repeated herein.

Figure 14A:
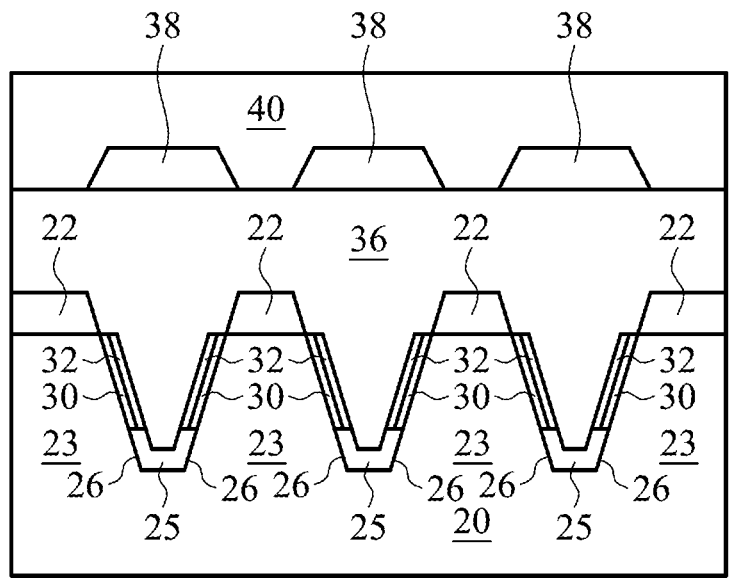
Figure 14B:
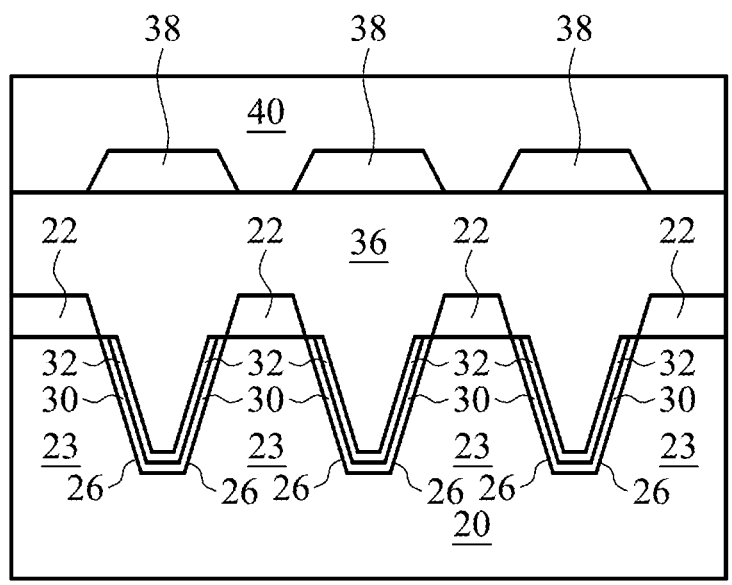

In the embodiments shown in FIGS. 6A through 13, recesses 24 have vertical sidewalls, which may be formed by using dry etch for the patterning of masks 22 and the etching of substrate 20. In alternative embodiments, as shown in FIG. 14A, sidewalls 26 of recesses 24 are slanted, which may be formed by using a combination of dry etch and wet etch for the patterning of masks 22 and for the etching of recesses 24. The slanted sidewalls of recesses 24 and masks 22 and 38 are suitable for the subsequent lateral growth of III-V compound semiconductor materials. Further, in the case, substrate 20 is a silicon substrate, slanted sidewalls 26 may have (111) surface orientations. This may be achieved by adopting a silicon substrate with a (100) top surface orientation, and etching substrate 20 by a wet etching, for example, using KOH as an etchant. Similar to the structure shown in FIG. 14A, recesses 24 having slanted sidewalls 26 may also be adopted by the embodiments shown in FIG. 9, in which there are no masks 25 on the bottoms of recesses 24. FIG. 14B illustrates such an alternative embodiment having slanted sidewalls 26, wherein no masks 25 as shown in FIG. 14A are formed.

Figure 15:
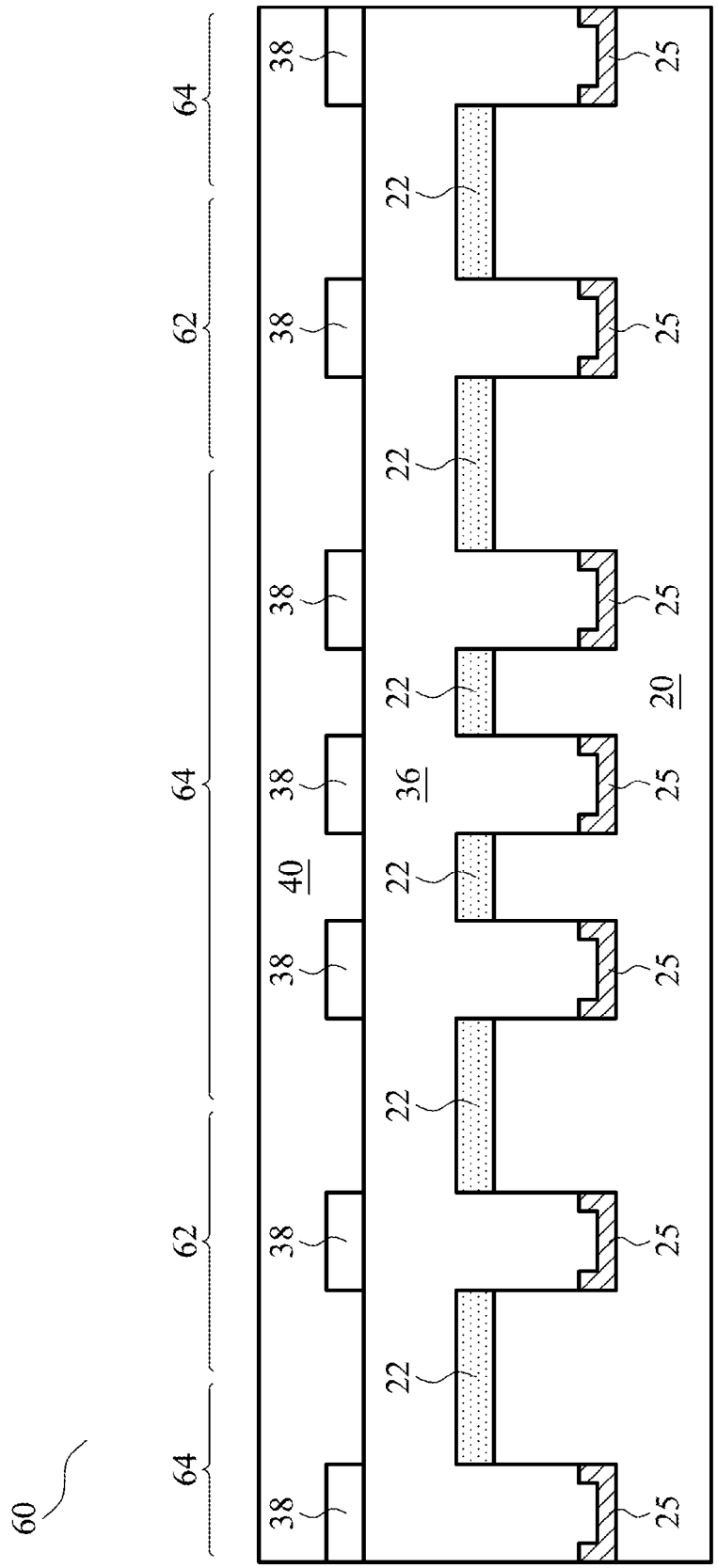
FIG. 15 illustrates a portion of a wafer including a III-V compound semiconductor film formed by an embodiment of the invention.

In the above-discussed embodiments, III-V compound semiconductor layer 36 and III-V compound semiconductor layer 40 may extend substantially across an entire chip, and even an entire wafer. FIG. 15 illustrates a portion of wafer 60, which includes chips 64, and scribe lines 62 separating chips 64. Recesses 24 as shown in FIG. 6A thus may be formed throughout chips 64, and may even be, although not required, formed in scribe lines. Alternatively, mask 38 in the scribe lines 62 region may be wide enough so that portions of III-V compound semiconductor layer 40 in the scribe lines 62 region do not join together by the lateral growth. Dicing through scribe lines 62 region mitigates some of the damaging stress effects of the dicing process.

The embodiments of the present invention may have other variations. For example, the formation of additional masks 38 and additional III-V compound semiconductor layer 40 may be omitted. Instead, the optoelectronic device may be formed on III-V compound semiconductor layer 36. Alternatively, after the formation of additional masks 38 and additional III-V compound semiconductor layer 40, more additional mask layers and additional III-V compound semiconductor layers may be formed to further reduce the number of defects in the topmost III-V compound semiconductor layer.

The embodiments of the present invention have several advantageous features. First, with the lateral growth, the resulting III-V semiconductor layers will have a reduced number of dislocations. Second, there are fewer process steps as compared to processes employing standard ELOG film growth.

In accordance with an embodiment, a structure includes a substrate including protrusions and recesses between the protrusions; masks over the protrusions of the substrate, wherein the recesses are un-covered by the masks; and a III-V compound semiconductor material including first portions extending into the recesses, and second portions over the masks. The first and the second portions are portions of a continuous III-V compound semiconductor layer.

In accordance with yet another aspect, a structure includes a substrate, a mask, a buffer/nucleation layer, and a group III-V compound semiconductor material. The substrate has a top surface and has a recess from the top surface. The recess includes a sidewall. The first mask is the top surface of the substrate. The buffer/nucleation layer is along the sidewall, and has a different material composition than a material composition of the sidewall. The III-V compound semiconductor material continuously extends from inside the recess on the buffer/nucleation layer to over the first mask.

In accordance with another aspect, a method includes providing a substrate; forming recesses in the substrate, wherein the substrate includes protrusions between the recesses, and wherein the recesses include sidewall and bottom surfaces; forming first masks covering top surfaces of the protrusions; forming second masks covering bottoms of the recesses; forming buffer/nucleation layers in the recesses; and growing a group-III nitride semiconductor material from the sidewalls of the recesses until the group-III nitride semiconductor material has portions higher than the first masks.

The advantageous features of the present invention include increased lateral growth effect and reduced process complexity due to the growth of the III-V compound semiconductor material in the recesses formed in substrates.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
a substrate having a top surface, the substrate having recesses from the top surface;
a first mask over the top surface, the first mask comprising a first dielectric material;
second mask portions along bottom surfaces of the recesses, the second mask portions comprising a second dielectric material; and
a group-III group-V (III-V) compound semiconductor material in the recesses and extending over the top surface of the substrate, the III-V compound semiconductor material forming a continuous layer over the top surface, the III-V compound semiconductor material being a different material than a material of the substrate in sidewalls of the recesses.

2. The structure of claim 1, wherein at least portions of the sidewalls of the recesses are free from the second masks.

3. The structure of claim 1 further comprising buffer/nucleation layers adjoining the sidewalls of the recesses, the buffer/nucleation layers being disposed between the sidewalls of the recesses and the III-V compound semiconductor material in the recesses.

4. The structure of claim 1 further comprising intermediate layers disposed between the sidewalls of the recesses and the III-V compound semiconductor material in the recesses.

5. The structure of claim 4, wherein the intermediate layers comprise pre-seeding layers, each of the pre-seeding layers consisting essentially of a metal.

6. The structure of claim 4, wherein the intermediate layers comprise transition layers, each of the transition layers consisting essentially of a metal, a metal alloy, a metal nitride, or a metal carbide.

7. The structure of claim 4 further comprising buffer/nucleation layers adjoining the intermediate layers, the intermediate layers being disposed between the sidewalls of the recesses and the buffer/nucleation layers.

8. The structure of claim 1, wherein the sidewalls of the recesses are vertical.

9. The structure of claim 1, wherein the sidewalls of the recesses are slanted.

10. A structure comprising:
a substrate comprising a recess from a top surface of the substrate, the recess comprising a sidewall;
a first mask comprising a first dielectric material on the top surface;
a second mask comprising a first dielectric material on a bottom surface of the recess, wherein a portion of the sidewall is uncovered by the second mask; and
a group-III group-V (III-V) compound semiconductor material continuously extending from inside the recess to over the first mask, the III-V compound semiconductor material being different from a material of the substrate in the sidewall.

11. The structure of claim 10 further comprising a buffer/nucleation layer along the sidewall, a material of the buffer/nucleation layer being different from the material of the substrate in the sidewall.

12. The structure of claim 10 further comprising an intermediate layer along the sidewall.

13. The structure of claim 12, wherein the intermediate layer comprises a pre-seeding layer, the pre-seeding layers consisting essentially of a metal.

14. The structure of claim 12, wherein the intermediate layer comprises a transition layer, the transition layer consisting essentially of a metal, a metal alloy, a metal nitride, or a metal carbide.

15. The structure of claim 10, wherein the first mask and the second mask are a same material.

16. The structure of claim 10, wherein the first mask and the second mask are different materials.

17. A method comprising:
    forming a first mask over a substrate;
    forming recesses in the substrate, the recesses comprising sidewall and bottom surfaces;
    forming second masks on the bottom surfaces of the recesses, at least portions of the sidewall surfaces of the recesses not being covered by the second masks; and
    growing a III-V compound semiconductor layer from the sidewall surfaces of the recesses at least until portions of the III-V compound semiconductor layer grown from the recesses coalesce to form a continuous III-V compound semiconductor layer.

18. The method of claim 17 further comprising forming a buffer/nucleation layer along the sidewall surfaces of the recesses, the III-V compound semiconductor layer being grown from the buffer/nucleation layer, the buffer/nucleation layer being formed at a lower temperature than the III-V compound semiconductor layer.

19. The method of claim 17 further comprising forming an intermediate layer along the sidewall surfaces of the recesses.

20. The method of claim 17, wherein at least one of the first mask and the second masks are conductive.

* * * * *